US011062546B1

(12) United States Patent
Davis et al.

(10) Patent No.: US 11,062,546 B1
(45) Date of Patent: Jul. 13, 2021

(54) VOTING SYSTEMS AND METHODS FOR ENCODING VOTING SELECTION DATA IN A COMPRESSED FORMAT

(71) Applicant: ELECTION SYSTEMS & SOFTWARE, LLC, Omaha, NE (US)

(72) Inventors: Michael Davis, Bellevue, NE (US); Bruno Roger, Omaha, NE (US); Casey Ballentine, Omaha, NE (US); Christopher Horvath, Cherry Valley, IL (US); Kevin Day, Papillion, NE (US)

(73) Assignee: ELECTION SYSTEMS & SOFTWARE, LLC, Omaha, NE (US)

( * ) Notice: Subject to any disclaimer, the term of this patent is extended or adjusted under 35 U.S.C. 154(b) by 0 days.

(21) Appl. No.: 17/132,542

(22) Filed: Dec. 23, 2020

(51) Int. Cl.
*G07C 13/00* (2006.01)
*G06K 19/06* (2006.01)
*H03M 13/00* (2006.01)
*G06F 40/126* (2020.01)

(52) U.S. Cl.
CPC .......... *G07C 13/00* (2013.01); *G06F 40/126* (2020.01); *G06K 19/06028* (2013.01); *G06K 19/06037* (2013.01); *H03M 13/6588* (2013.01)

(58) Field of Classification Search
CPC ....... G06K 19/06028; G06K 19/06037; G06K 19/06159; G07C 13/00; G06F 40/126
See application file for complete search history.

(56) References Cited

U.S. PATENT DOCUMENTS

| | | | |
|---|---|---|---|
| 7,387,244 | B2 | 6/2008 | Bolton et al. |
| 8,191,764 | B2 | 6/2012 | Bolton |
| 8,733,646 | B2 | 5/2014 | Bolton et al. |
| 8,814,045 | B1 | 8/2014 | Brockhouse et al. |
| 8,991,701 | B2 | 3/2015 | Bolton et al. |

(Continued)

FOREIGN PATENT DOCUMENTS

| | | |
|---|---|---|
| CA | 2806098 | 2/2017 |

*Primary Examiner* — Thien M Le
(74) *Attorney, Agent, or Firm* — Stinson LLP

(57) ABSTRACT

Various voting systems are disclosed that include a voting device configured to: provide a user interface that presents one or more voting choices for each of one or more contests and enables a voter to select one or more of the voting choices for each of the one or more contests; create a bitmap comprising a plurality of bit cells each of which corresponds to one of the voting choices of one of the contests, wherein each of the bit cells stores a binary digit that indicates whether the voter selected the voting choice corresponding to the bit cell; convert the binary digits stored in the bitmap to a compressed string of characters; generate one or more selection barcodes that encode the compressed string of characters; and print the one or more selection barcodes on a paper medium to create a paper ballot. The voting systems also include a ballot tabulation device configured to: read the one or more selection barcodes printed on the paper ballot to decode the compressed string of characters; convert the compressed string of characters to binary digits; analyze the binary digits to determine the selected voting choices; and store the selected voting choices in a cast vote record for the paper ballot. Various voting methods that utilize encoding schemas for compressing voting selection data are also disclosed.

30 Claims, 15 Drawing Sheets

(56) References Cited

U.S. PATENT DOCUMENTS

| | | | | |
|---|---|---|---|---|
| 10,147,259 | B1 | 12/2018 | Dvorak | |
| 2002/0074399 | A1* | 6/2002 | Hall | G07C 13/00 235/386 |
| 2005/0218225 | A1* | 10/2005 | Johnson | G07C 13/00 235/386 |
| 2008/0167881 | A1* | 7/2008 | Haas | H04L 1/007 704/500 |
| 2013/0085815 | A1* | 4/2013 | Onischuk | G07C 13/00 705/12 |
| 2014/0207537 | A1* | 7/2014 | Joyce | G07C 13/00 705/12 |
| 2014/0231512 | A1* | 8/2014 | Onischuk | G07C 13/00 235/386 |
| 2014/0365281 | A1* | 12/2014 | Onischuk | G07C 13/00 705/12 |
| 2015/0012339 | A1* | 1/2015 | Onischuk | G07C 13/00 705/12 |
| 2017/0364778 | A1* | 12/2017 | Watanabe | B23K 26/0006 |
| 2018/0211466 | A1* | 7/2018 | Cheng Chuah | B42D 25/305 |
| 2018/0350180 | A1* | 12/2018 | Onischuk | G07C 13/00 |
| 2019/0213820 | A1* | 7/2019 | Sebes | G07C 13/00 |
| 2020/0242872 | A1 | 7/2020 | Deutsch | |
| 2020/0357215 | A1 | 11/2020 | Deutsch et al. | |

* cited by examiner

FIG. 5

```
<Cont id="0001">
   <Name>CONTEST 0001 </Name>
   <ContSummary>
   <Name>CONTEST 0001
Vote for One</Name>
   </ContSummary>
   <Cand id="101" row="10" col="9" side="1" targetId="Oval">
      <Name>CANDIDATE 0001</Name>
   </Cand>
   <Cand id="102" row="13" col="9" side="1" targetId="Oval">
      <Name>CANDIDATE 0002</Name>
   </Cand>
   <Cand id="103" row="16" col="9" side="1" targetId="Oval">
      <Name>CANDIDATE 0003</Name>
   </Cand>
   <Cand id="104" row="19" col="9" side="1" targetId="Oval">
      <Name>CANDIDATE 0004</Name>
   </Cand>
   <Cand id="105" row="22" col="9" side="1" targetId="Oval">
      <Name>CANDIDATE 0005</Name>
   </Cand>
</Cont>
```

FIG. 6

| Contest #1 | | | | | |
|---|---|---|---|---|---|
| col/row | 9/10 | 9/13 | 9/16 | 9/19 | 9/22 |
| cont ID | 0001 | 0001 | 0001 | 0001 | 0001 |
| cand ID | 101 | 102 | 103 | 104 | 105 |
| voted = 1 | 1 | 0 | 0 | 0 | 0 |

FIG. 7

| | | | | | | | | | | | | | | |
|---|---|---|---|---|---|---|---|---|---|---|---|---|---|---|
| Contest #1 | | | | | Contest #2 | | | | | Contest #3 | | | | |
| #1 | #2 | #3 | #4 | #5 | #1 | #2 | #3 | #4 | #5 | #1 | #2 | #3 | #4 | #5 |
| 1 | 0 | 0 | 0 | 0 | 0 | 1 | 0 | 0 | 0 | 0 | 0 | 0 | 1 | 1 |
| Cluster 1 → | | | Cluster 2 → | | | Cluster 3 → | | | Cluster 4 → | | | Cluster 5 → | | |

| | | | | | | | | | | | | | | |
|---|---|---|---|---|---|---|---|---|---|---|---|---|---|---|
| Contest #4 | | | | | Contest #5 | | | | | Contest #6 | | | | |
| #1 | #2 | #3 | #4 | #5 | #1 | #2 | #3 | #4 | #5 | #1 | #2 | #3 | #4 | #5 |
| 1 | 0 | 0 | 1 | 1 | 0 | 0 | 0 | 0 | 1 | 1 | 0 | 0 | 0 | 0 |
| Cluster 6 → | | | Cluster 7 → | | | Cluster 8 → | | | Cluster 9 → | | | Cluster 10 → | | |

| | | | | | | | | | | | | | | |
|---|---|---|---|---|---|---|---|---|---|---|---|---|---|---|
| Contest #7 | | | | | Contest #8 | | | | | Contest #9 | | | | |
| #1 | #2 | #3 | #4 | #5 | #1 | #2 | #3 | #4 | #5 | #1 | #2 | #3 | #4 | #5 |
| 0 | 1 | 0 | 0 | 0 | 0 | 0 | 1 | 0 | 0 | 0 | 0 | 0 | 1 | 0 |
| Cluster 11 → | | | Cluster 12 → | | | Cluster 13 → | | | Cluster 14 → | | | Cluster 15 → | | |

| | | | | | | | | | | | | | | |
|---|---|---|---|---|---|---|---|---|---|---|---|---|---|---|
| Contest #10 | | | | | Contest #11 | | | | | Contest #12 | | | | |
| #1 | #2 | #3 | #4 | #5 | #1 | #2 | #3 | #4 | #5 | #1 | #2 | #3 | #4 | #5 |
| 0 | 0 | 0 | 0 | 1 | 1 | 0 | 0 | 0 | 0 | 0 | 1 | 0 | 0 | 0 |
| Cluster 16 → | | | Cluster 17 → | | | Cluster 18 → | | | Cluster 19 → | | | Cluster 20 → | | |

FIG. 8

| Cluster # | Binary | Octal |
|---|---|---|
| 1 | 100 | 4 |
| 2 | 000 | 0 |
| 3 | 100 | 4 |
| 4 | 000 | 0 |
| 5 | 011 | 3 |
| 6 | 100 | 4 |
| 7 | 110 | 6 |
| 8 | 000 | 0 |
| 9 | 110 | 6 |
| 10 | 000 | 0 |
| 11 | 010 | 2 |
| 12 | 000 | 0 |
| 13 | 010 | 2 |
| 14 | 000 | 0 |
| 15 | 010 | 2 |
| 16 | 000 | 0 |
| 17 | 011 | 3 |
| 18 | 000 | 0 |
| 19 | 001 | 1 |
| 20 | 000 | 0 |

FIG. 9

| Start | # | Oval Position Bitmap (35 octal numbers) | Check | Stop |
|---|---|---|---|---|
| | 1 | 40403460602020203010000000000000000 | | |

FIG. 11

| Contest #1 | | | | | Contest #2 | | | | | Contest #3 | | | | |
|---|---|---|---|---|---|---|---|---|---|---|---|---|---|---|
| #1 | #2 | #3 | #4 | #5 | #1 | #2 | #3 | #4 | #5 | #1 | #2 | #3 | #4 | #5 |
| 1 | 0 | 0 | 0 | 0 | 0 | 1 | 0 | 0 | 0 | 0 | 0 | 0 | 1 | 1 |
| Cluster 1 | | | | | | | ← | Cluster 2 | | | | | | ← |

| Contest #4 | | | | | Contest #5 | | | | | Contest #6 | | | | |
|---|---|---|---|---|---|---|---|---|---|---|---|---|---|---|
| #1 | #2 | #3 | #4 | #5 | #1 | #2 | #3 | #4 | #5 | #1 | #2 | #3 | #4 | #5 |
| 1 | 0 | 0 | 1 | 1 | 0 | 0 | 0 | 0 | 1 | 1 | 0 | 0 | 0 | 0 |
| ← | Cluster 3 | | | | | | | ← | Cluster 4 | | | | | |

| Contest #7 | | | | | Contest #8 | | | | | Contest #9 | | | | |
|---|---|---|---|---|---|---|---|---|---|---|---|---|---|---|
| #1 | #2 | #3 | #4 | #5 | #1 | #2 | #3 | #4 | #5 | #1 | #2 | #3 | #4 | #5 |
| 0 | 1 | 0 | 0 | 0 | 0 | 0 | 1 | 0 | 0 | 0 | 0 | 0 | 1 | 0 |
| | ← | Cluster 5 | | | | | | | ← | Cluster 6 | | | | ← |

| Contest #10 | | | | | Contest #11 | | | | | Contest #12 | | | | |
|---|---|---|---|---|---|---|---|---|---|---|---|---|---|---|
| #1 | #2 | #3 | #4 | #5 | #1 | #2 | #3 | #4 | #5 | #1 | #2 | #3 | #4 | #5 |
| 0 | 0 | 0 | 0 | 1 | 1 | 0 | 0 | 0 | 0 | 0 | 1 | 0 | 0 | 0 |
| | | ← | Cluster 7 | | | | | | | ← | Cluster 8 | | | ← |

FIG. 12

| Cluster # | Binary | Hexadecimal |
|---|---|---|
| 1 | 01000001 | 41 |
| 2 | 11100000 | E0 |
| 3 | 00001100 | 0C |
| 4 | 10000011 | 83 |
| 5 | 00100000 | 20 |
| 6 | 00001000 | 08 |
| 7 | 00000110 | 06 |
| 8 | 00000001 | 01 |

FIG. 13

VOTING SYSTEMS AND METHODS FOR ENCODING VOTING SELECTION DATA IN A COMPRESSED FORMAT

CROSS-REFERENCE TO RELATED APPLICATIONS

Not applicable.

BACKGROUND OF THE INVENTION

1. Field of the Invention

The present disclosure is generally related to voting systems and methods and, more particularly, to systems and methods for encoding voting selection data in barcodes printed on paper ballots.

2. Description of Related Art

A variety of different types of paper-based voting systems are used in the United States and throughout the world. One type of voting system is a ballot marking device that allows a voter to electronically enter his or her voting selections and then prints a paper ballot that includes a summary of the voting selections. In some cases, the paper ballot is discharged from the ballot marking device for insertion into a separate ballot tabulation device. The ballot tabulation device is typically a precinct-based or central ballot scanner used to tabulate hand-marked standard-size paper ballots, which may also be used to read the paper ballots generated by the ballot marking device and store the voting selections within a cast vote record (CVR) for each ballot. In other cases, the paper ballot is retained by the ballot marking device, which reads the paper ballot and stores the voting selections within a CVR for the ballot, i.e., the device operates as a combined ballot marking device/ballot tabulation device.

FIG. 1 illustrates an exemplary paper ballot 100 that may be generated by a ballot marking device. In this example, the paper ballot 100 includes an activation barcode 102 and verification digits 104 that are printed by an electronic pollbook prior to insertion of the paper ballot into the ballot marking device. The activation barcode 102 encodes an election code that can be read by the ballot marking device and/or ballot tabulation device. In this example, the activation barcode 102 encodes an eight-digit number that identifies the appropriate ballot style for the voter (i.e., the contests and corresponding voting choices applicable to that voter) based on a pre-loaded election definition. The verification digits 104 are human-readable so that a user can verify the accuracy of the activation barcode 102. The paper ballot 100 also includes human-readable header text 106 that specifies the election name, election date, location, and precinct information based on the activation barcode 102, which may be printed by the electronic pollbook or the ballot marking device depending on the implementation.

Paper ballot 100 also includes a master barcode 108 that encodes information to enable the ballot tabulation device to process the paper ballot 100. In this example, the master barcode 108 encodes a twenty-eight-digit number that includes a precinct identifier (10 digits), a ballot style identifier (10 digits), the number of write-in votes (3 digits), the total number of voting selections (3 digits), the judges' initial box status (1 digit), and the review box status (1 digit). Of course, other types of information may be encoded in the master barcode 108. The paper ballot 100 also includes a plurality of selection barcodes 110, each of which encodes information representing a voting selection made by the voter, as well as human-readable text identifying the voting selections 112 (e.g., the name of each contest and selected candidate(s)). It should be understood that the master barcode 108, selection barcodes 110, and text identifying the voting selections 112, are printed by the ballot marking device.

The ballot marking device may utilize different types of encoding schemas to encode the voting selections in the selection barcodes 110. For example, many jurisdictions use a grid-based encoding schema that is based on the format of an 8.5-inch-wide standard-size paper ballot in which each oval on the ballot can be represented by a six-digit number comprising the column number (2 digits), the row number (2 digits), the side of a sheet (1 digit), and the sheet number (1 digit). For example, an oval located on the first sheet of the paper ballot ("1"), the first side of that first sheet ("1"), the tenth column of that first side ("10"), and the fifteen row of that first side ("15"), may be represented by the six-digit number 101511 (wherein the digits are in the order of column, row, side, sheet). Of course, the digits may be ordered differently depending on the implementation. Thus, with decimal encoding, six digits are required to encode a single oval position corresponding to a single voting selection. It is that six-digit number that is encoded in one of the selection barcodes 110 shown in FIG. 1.

Because a selection barcode 110 must be printed for each voting selection, it can be appreciated that the paper ballot 100 shown in FIG. 1 will vary in length depending on the number of voting selections made by a voter in a particular election. For an election with a large number of contests, the paper ballot may be undesirably long. It can also be appreciated that only the encoded representation of the voting selection is encoded in each selection barcode 110 and that the selection barcode 110 is not used to encode other information. Thus, there is a need for improved voting systems and methods that are able to print paper ballots with reduced lengths and optionally with barcodes that are able to encode information beyond the encoded representations of the voting selections.

BRIEF SUMMARY OF THE INVENTION

The present invention is directed to voting systems and methods for encoding voting selection data in a compressed format. Encoding schemas are disclosed that enable a voter's voting selections to be represented by a compressed string of characters, which are then encoded in one or more selection barcodes printed on a paper ballot. The encoding schemas enable the use of selection barcode(s) that occupy less space on the paper ballot and, thus, the length of the paper ballot is reduced. Also, in some cases, the selection barcode(s) encode not just the compressed string of characters, but also other types of information such as letters that represent the names of the candidates selected by the voter. Of course, decoding schemas corresponding to the above-mentioned encoding schemas are also used to decode the voting selections from the selection barcode(s) printed on the paper ballot.

A voting device in accordance with one exemplary embodiment of the invention described herein comprises a processing unit configured to: (a) provide a user interface that (i) presents one or more voting choices for each of one or more contests and (ii) enables a voter to select one or more of the voting choices for each of the one or more contests; (b) create a bitmap comprising a plurality of bit cells each of which corresponds to one of the voting choices of one of the contests, wherein each of the bit cells stores a binary digit that indicates whether the voter selected the voting choice corresponding to the bit cell; (c) convert the binary digits stored in the bitmap to a compressed string of characters; and (d) generate one or more selection barcodes that encode the compressed string of characters. The voting device also comprises a printer configured to print the one or more selection barcodes on a paper medium to create a paper ballot.

A method for generating a paper ballot in accordance with another exemplary embodiment of the invention described herein comprises the steps of: presenting one or more voting choices for each of one or more contests; receiving one more selections of one or more of the voting choices for each of the one or more contests; creating a bitmap comprising a plurality of bit cells each of which corresponds to one of the voting choices of one of the contests, wherein each of the bit cells stores a binary digit that indicates whether the voting choice corresponding to the bit cell is selected; converting the binary digits stored in the bitmap to a compressed string of characters; generating one or more selection barcodes that encode the compressed string of characters; and printing the one or more selection barcodes on a paper medium to create the paper ballot.

A voting system in accordance with yet another exemplary embodiment of the invention described herein comprises a voting device configured to: (a) provide a user interface that (i) presents one or more voting choices for each of one or more contests and (ii) enables a voter to select one or more of the voting choices for each of the one or more contests; (b) create a bitmap comprising a plurality of bit cells each of which corresponds to one of the voting choices of one of the contests, wherein each of the bit cells stores a binary digit that indicates whether the voter selected the voting choice corresponding to the bit cell; (c) convert the binary digits stored in the bitmap to a compressed string of characters; (d) generate one or more selection barcodes that encode the compressed string of characters; and (e) print the one or more selection barcodes on a paper medium to create a paper ballot. The voting system also comprises a ballot tabulation device configured to: (a) read the one or more selection barcodes printed on the paper ballot to decode the compressed string of characters; (b) convert the compressed string of characters to binary digits; (c) analyze the binary digits to determine the selected voting choices; and (d) store the selected voting choices in a cast vote record for the paper ballot.

Various other embodiments and features of the present invention are described in detail below, or will be apparent to one skilled in the art based on the disclosure provided herein, or may be learned from the practice of the invention.

BRIEF DESCRIPTION OF THE DRAWINGS

FIG. 5 is an exemplary portion of an .xml file for one contest of an election.

FIG. 6 is an exemplary selection bitmap corresponding to the contest defined in

FIG. 5.

FIG. 7 is an exemplary selection bitmap for twelve contests of an election, with the bits grouped in clusters of three bits that are read from left to right.

FIG. 8 is a table showing the bit clusters shown in FIG. 7 converted from binary numbers to a string of octal numeric characters.

FIG. 9 is an exemplary one-dimensional barcode that encodes the string of octal numeric characters shown in FIG. 8.

FIG. 11 is an exemplary selection bitmap for twelve contests of an election, with the bits grouped in clusters of eight bits that are read from right to left.

FIG. 12 is a table showing the bit clusters shown in FIG. 11 converted from binary numbers to a string of hexadecimal alphanumeric characters.

FIG. 13 is an exemplary two-dimensional barcode that encodes the string of hexadecimal alphanumeric characters shown in FIG. 12.

DETAILED DESCRIPTION OF EXEMPLARY EMBODIMENTS

Figure 1:
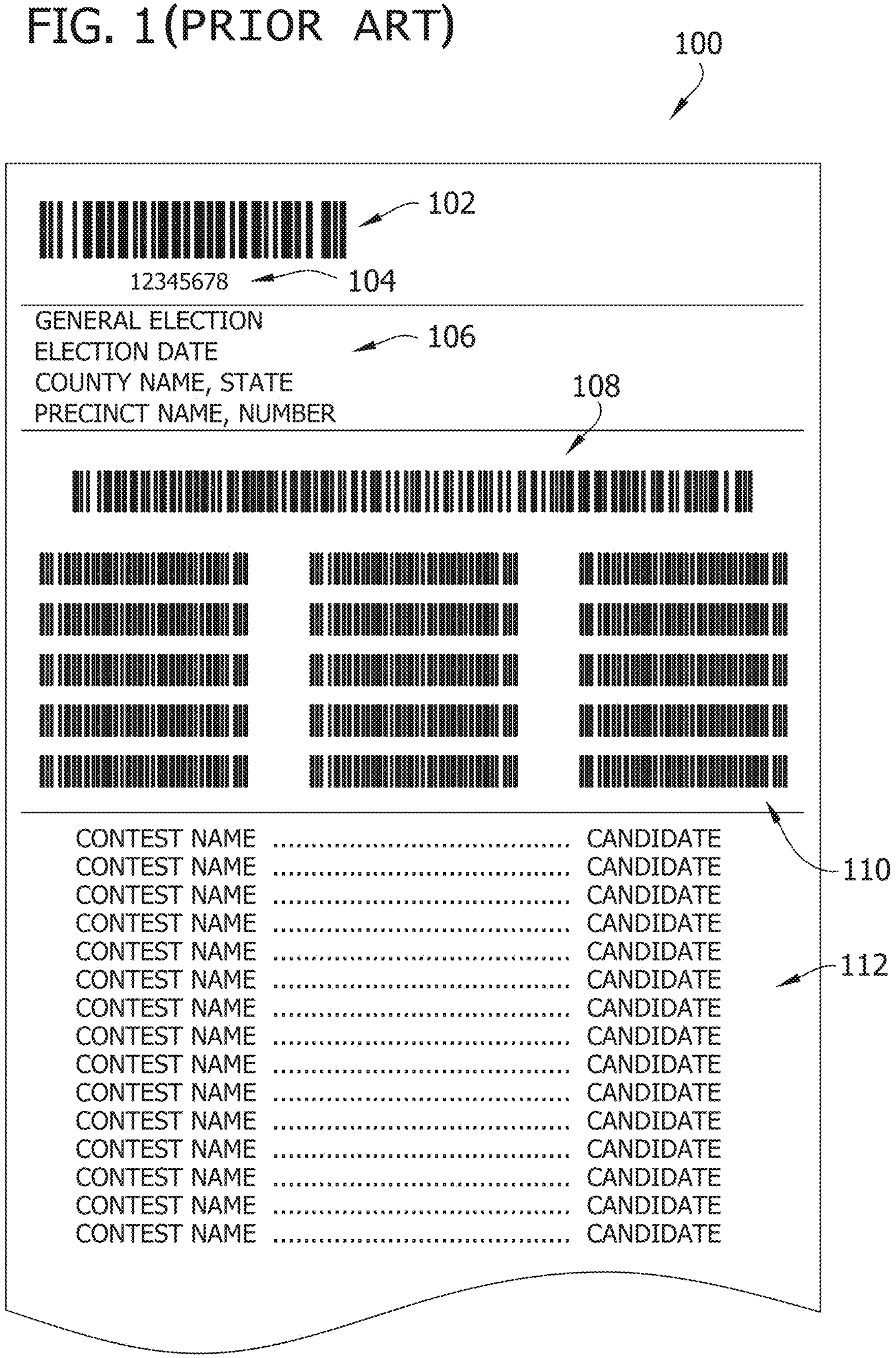
FIG. 1 illustrates an exemplary paper ballot of the prior art.

The present invention is directed to voting systems and methods for encoding voting selection data in a compressed format. While the invention will be described in detail below with reference to various exemplary embodiments, it should be understood that the invention is not limited to the specific system configurations or methodologies of these embodiments. In addition, although the exemplary embodiments are described as embodying several different inventive features, one skilled in the art will appreciate that any one of these features could be implemented without the others in accordance with the invention.

In the present disclosure, references to "one embodiment," "an embodiment," "an exemplary embodiment," or "embodiments" mean that the feature or features being described are included in at least one embodiment of the invention. Separate references to "one embodiment," "an embodiment," "an exemplary embodiment," or "embodiments" in this disclosure do not necessarily refer to the same embodiment and are also not mutually exclusive unless so stated and/or except as will be readily apparent to one skilled in the art from the description. For example, a feature, structure, function, etc. described in one embodiment may also be included in other embodiments, but is not necessarily included. Thus, the present invention can include a variety of combinations and/or integrations of the embodiments described herein.

Generally, the present disclosure describes voting devices for generating paper ballots in which the voting selections of a voter are encoded in one or more selection barcodes printed on the ballot. In some embodiments, the voting device implements an encoding schema that utilize a bitmap with a plurality of bit cells each of which corresponds to one of the voting choices of one of the contests in the election. Each of the bit cells stores a binary digit that indicates whether the voter selected the voting choice corresponding to the bit cell. The bits stored in the bitmap are then grouped and converted from binary numbers to either octal or hexadecimal characters (or any other numbering system that enables compression of the binary numbers) to thereby generate a compressed string of characters. This compressed string of characters is then encoded in one or more selection barcodes printed on the paper ballot. Exemplary barcodes that may be used to encode the compressed string of characters include, but are not limited to, one-dimensional barcodes (e.g., linear barcodes), two-dimensional barcodes (e.g., matrix barcodes), and the like.

The encoding schemas described herein enable the use of selection barcodes that occupy less space on the paper ballot and, thus, the length of the paper ballot is reduced. Also, in some embodiments, other information may be encoded in the selection barcode(s) along with the compressed string of characters. For example, letters representing the name of each selected candidate may be encoded in the barcodes. A computing device running a suitable software application may then be used to decode the barcodes and present the letters to the voter. As such, the voter viewing the decoded letters may have a higher level of confidence that his/her voting selections have been correctly encoded in the selection barcodes.

The present disclosure further describes ballot tabulation devices for tabulating the paper ballots. In some embodiments, the ballot tabulation device implements a decoding schema that reads the one or more selection barcodes printed on the paper ballot to decode the compressed string of characters. The compressed string of characters is then converted to binary digits, which are analyzed to determine the voting selections of the voter. The voting selections are then stored in a cast vote record (CVR) for the paper ballot. It can be appreciated that the decoding schema will simply reverse the steps of the encoding schema used to generate the selections barcodes printed on the paper ballots.

Various voting systems and methods that may be used to implement the present invention will now be described. Of course, it should be understood that these voting systems and methods are merely provided as exemplary embodiments and that other types of voting systems and methods may also be used within the scope of the invention.

I. Exemplary Voting Systems

Figure 2A:
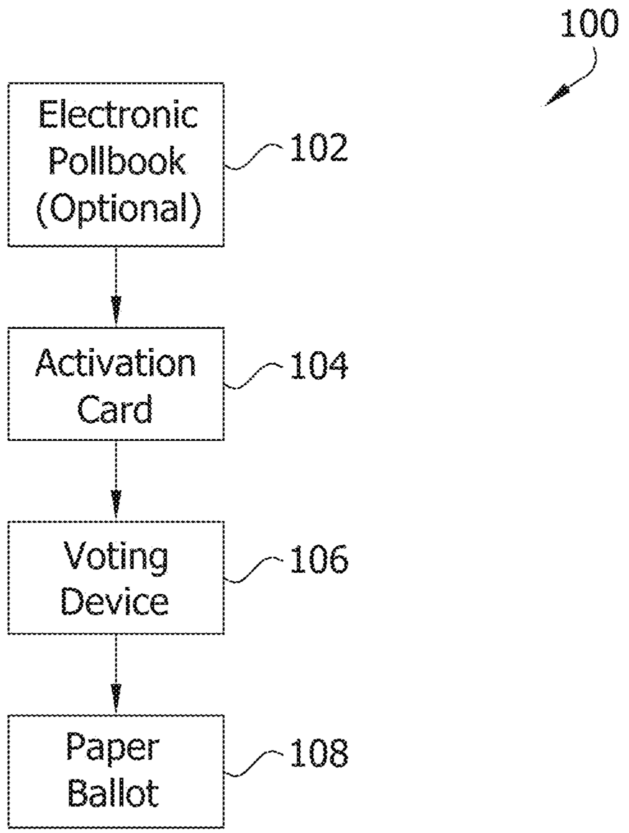
FIGS. 2A and 2B are block diagrams of an exemplary voting system that includes an electronic pollbook, a voting device, a ballot tabulation device and an election management system in accordance with an embodiment of the invention.

Referring to FIG. 2A, a voting system that may be used in some embodiments of the invention is generally indicated by reference number 200. In general terms, the voting system 200 includes an electronic pollbook 202 configured to generate an activation card 204 that is provided to a voter. The activation card 204 is inserted into a voting device 206 to activate a voting session. The voting device 206 is configured to provide a user interface that enables the voter to input his or her voting selections, and then print the voting selections and other information on the activation card 204 to create a paper ballot 208. Thus, the paper ballot 208 comprises the activation card 204 with the voting selections and other information printed thereon.

In most jurisdictions, the electronic pollbook 202 has access to the voter registration records and may be used to check in a voter at a polling location. Preferably, the electronic pollbook 202 is configured to determine an election code that identifies the precinct and/or ballot style for the voter. The election code is printed on the activation card 204 in machine-readable form (and optionally human-readable form) so that it can be read by the voting device 206 and/or ballot tabulation device 254 (FIG. 2B) to determine the appropriate ballot style for the voter (i.e., the contests and contest choices applicable to that voter) based on a pre-loaded election definition. The election definition is commonly created via an election management system 256 (FIG. 2B), which is typically used at a central election office. The election management system 256 enables an administrator to create an election database that includes all of the district, contest, candidate and precinct information for the jurisdiction. This information is used to create the election definition files for each of the voting devices in the jurisdiction.

In an alternative embodiment, a blank card may be used as the activation card 204 that activates the voting device 206. However, in this embodiment, the poll worker must enter the voter's precinct and/or ballot style into the voting device 206 (unless, of course, there is only one precinct and one ballot style in the election definition).

An example of a suitable electronic pollbook that may be used as the electronic pollbook 202 of voting system 200 is the ExpressPoll® electronic pollbook available from Election Systems & Software, LLC.

The voting device 206 may have a variety of different configurations and may be used for different purposes. In some embodiments, the voting device 206 is utilized only as a ballot marking device. In one embodiment, the voter's voting selections are encoded in a compressed format, i.e., a string of compressed characters, which are then encoded in one or more selection barcodes printed on the activation card 204 to create the paper ballot 208. The paper ballot 208 is then discharged from the voting device 206 to the voter, and the voting device 206 does not retain a record of the voting selections after the voting session has ended. The voter then inserts the paper ballot 208 into the ballot tabulation device 254 (FIG. 2B) for scanning and tabulation. In other embodiments, the voting device 206 is used both as a ballot marking device (as generally described above), and also as a ballot tabulation device. In this case, the paper ballot 208 may be retained by the voting device 206 for scanning and tabulation, or, the paper ballot 208 may be discharged from the voting device 206 to the voter whereby the voter re-inserts the paper ballot 208 back into the voting device 206 for scanning and tabulation.

The voting device 206 is configured to receive the activation card 204 and activate the voting session in response thereto, e.g., the voting device 206 may read the machine-readable election code on the activation card 204 to determine the appropriate ballot style for the voter (i.e. the contests and contest choices applicable to that voter) based on a pre-loaded election definition. The voting device 206 is then configured to provide a user interface that presents the contest choices for each contest to the voter. The user interface also enables the voter to input one or more voting selections for each of the contests. A voting selection comprises the contest choice selected by the voter from the contest choices for a particular contest. Each contest may allow the voter to make one voting selection (e.g., select one of the candidates for a particular race) or more than one voting selection (e.g., select two or more of the candidates for a particular race). If a voter does not make the permitted number of voting selections for a particular contest, it may be considered a ballot irregularity (e.g., under vote, etc.). It should be understood that the systems and methods described herein can accommodate all ballots regardless of whether or not a particular ballot contains a ballot irregularity.

The voting device 206 is also configured to print the voting selections made by the voter on the activation card 204 to create the paper ballot 208. The voting selections are printed in machine-readable form (i.e., the voting selections are encoded in one or more selection barcodes printed on the paper ballot 208) and optionally in human-readable form. The encoding schemas that may be used to encode the voting selections in a compressed format, i.e., a compressed string of characters encoded in one or more selection barcodes, will be described in greater detail below.

Figure 3:
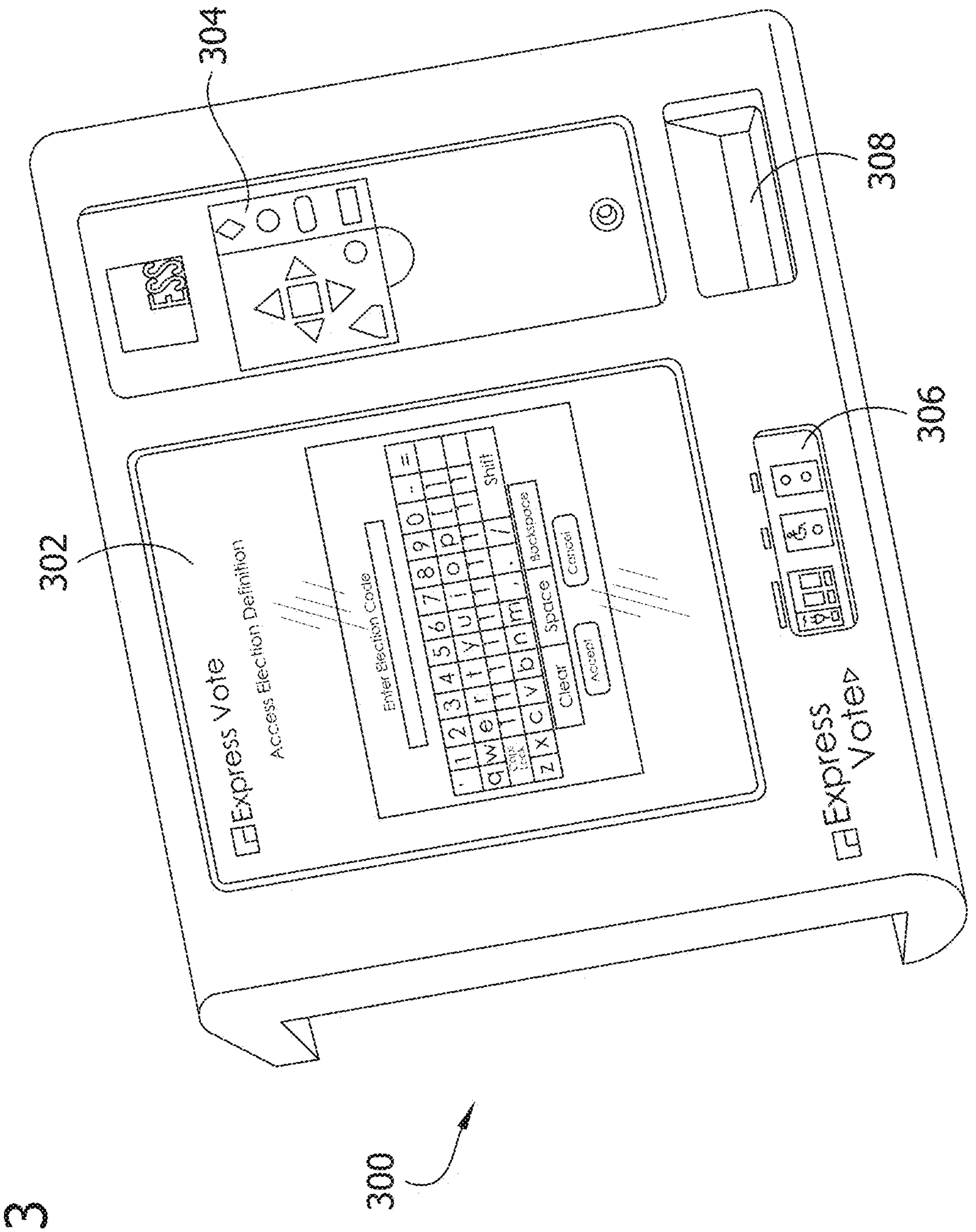
FIG. 3 is a perspective view of an exemplary voting device that may be used in the voting system of FIG. 2A.

Referring to FIG. 3, an exemplary embodiment of the voting device 206 is generally indicated by reference number 300. The voting device 300 generally includes a touchscreen display 302, a keypad 304, an auxiliary panel 306, and an opening 308, as described below. The voting device 300 also includes an internal printer (not shown) that prints the selection barcodes and other information on the activation card 204. Preferably, voting device 300 complies with the requirements of the Americans with Disabilities Act (ADA), the 2002 and 2005 voluntary voting system guidelines (VVSG), and the Help America Vote Act of 2002.

The opening 308 in the voting device 300 is configured to receive an activation card 204 from a voter. As described above, the activation card 204 preferably includes a machine-readable marking (e.g., an activation barcode) that can be read by voting device 300 to determine the appropriate electronic ballot for the voter.

The voting device 300 also includes a variety of different input and output devices that can be used to facilitate the voting process for different voters. For example, the touchscreen display 302 is configured to display the contests and associated contest choices to a voter and allow the voter to navigate through voting menus and enter his or her voting selections. The keypad 304 allows a voter to navigate through the voting menus and enter his or her contest selections as an alternative to the input capabilities of the touchscreen display 302. The keys of the keypad 304 may be embossed with Braille descriptions, may be color coded, and/or may have unique shapes to make the keypad 304 suitable for use by voters with different types of disabilities. While the keypad 304 is shown as being mounted to the housing of the voting device 300, the keypad could alternatively be provided as a separate peripheral device that is connectable to the auxiliary panel 306.

For voters who cannot use touchscreen display 302 and/or keypad 304, the voting device 300 includes an auxiliary panel 306 that provides a dual switch access port to permit the connection of a dual switch access device, such as a sip and puff device, paddle switch, floor switch, or any similar two position switching device known in the art. A voter may also connect headphones to an audio port in order to listen to an audio ballot listing the contest choices for each of the contests in the election. A blind or vision impaired voter listening to the audio ballot may use keypad 304 or any two position switching device to make his or her voting selections. The audio ballot may be played in a number of different languages for voters who do not speak the native language of the jurisdiction. The audio ballot may be generated with either speech synthesis or pre-recorded audio, for example.

After the voter enters and confirms his or her voting selections, an internal printer (not shown) of the voting device 300 prints one or more selection barcodes and other information on the activation card 204 to create the paper ballot 208. For example, the paper ballot 208 may comprise either of the ballots shown in FIGS. 10 and 14, described below.

If the voting device 300 is used only as a ballot marking device, the paper ballot 208 is discharged through the opening 308 to the voter, and the voting device 300 does not retain a record of the voting selections after the voting session has ended. The voter then inserts the paper ballot 208 into the ballot tabulation device 254 (FIG. 2B) for scanning and tabulation.

If the voting device 300 is used as a combined ballot marking device/ballot tabulation device, the voting device 300 may retain the paper ballot 208 for scanning and tabulation, in which case the voter is preferably allowed to review the paper ballot 208 through a window (not shown) of the voting device 300 and be provided with an option to accept or reject the paper ballot 208. Alternatively, the voting device 300 may discharge the paper ballot 208 through the opening 308 so that the voter can review the paper ballot 208. If the paper ballot 208 is acceptable, the voter re-inserts the paper ballot 208 back through the opening 308 into the voting device 300 for scanning and tabulation. The functionality of the scanning and tabulation aspect of voting device 300 will be described in greater detail below.

Examples of suitable ballot marking devices that may be modified for use as the voting device 206 in the voting system 200 (e.g., by adding all of the functionality relating to the encoding of the voting selections in the selection barcode(s) printed on the paper ballot 208, as described herein) are the ExpressVote® universal voting system and ExpressVote® XL full-face universal voting system, both of which are available from Election Systems & Software, LLC. It should be noted that each of these systems can be configured for use as a ballot marking device, or as a combination ballot marking device/ballot tabulation device as described herein.

It should be understood that the components of the voting system 200 described above are merely examples and that a variety of other types of electronic pollbooks (which are optional and may not be used in all embodiments), activation cards, voting devices and paper ballots may also be used within the scope of the present invention.

Figure 2B:
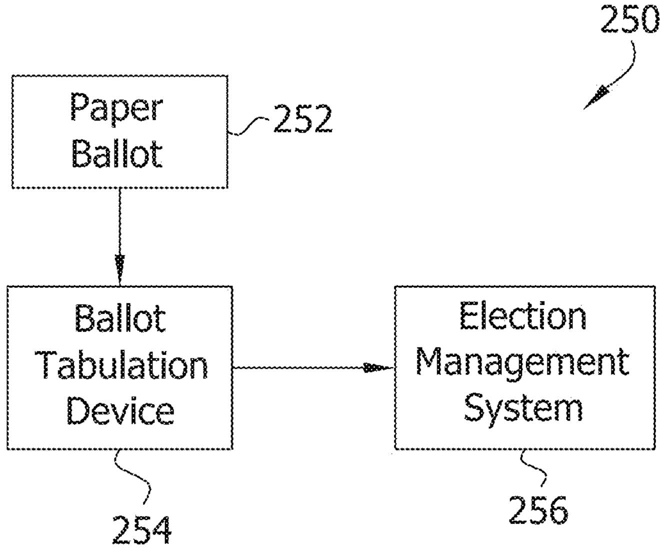

Referring now to FIG. 2B, a voting system that may be used in some embodiments of the invention is generally indicated by reference number 250. In general terms, the voting system 250 includes a paper ballot 252 that is inserted into a ballot tabulation device 254 for scanning and tabulation, as well as an election management system 256 that is used to process the election results after the close of the election. In some embodiments, the paper ballot 252 may comprise either an 8.5-inch-wide standard-size paper ballot or a paper ballot 208 generated by the voting device 206.

In some embodiments, the voting system 250 shown in FIG. 1B is used in combination with the voting system 200 shown in FIG. 2A, in which case the paper ballot 252 inserted into the ballot tabulation device 254 is the paper ballot 208 generated by the voting device 206. In one embodiment, the ballot tabulation device 254 is a separate component from the voting device 206, in which case the ballot is discharged from the voting device 206 to the voter, and then the voter inserts the ballot into the ballot tabulation device 254 for scanning and tabulation. In another embodiment, the ballot tabulation device 254 comprises the voting device 206 (e.g., the voting device 206 functions as a ballot marking device/ballot tabulation device). In this case, the ballot may be retained by the voting device 206 for scanning and tabulation, or, the ballot may be discharged from the voting device 206 to the voter whereby the voter re-inserts the ballot back into the voting device 206 for scanning and tabulation, as described above.

In some embodiments, the ballot tabulation device 254 comprises a precinct-based device configured to receive and scan the paper ballot 252. In one embodiment, the ballot tabulation device 254 is configured to read the machine-readable election code printed on the paper ballot 252 to determine the appropriate ballot style based on the pre-loaded election definition. The ballot tabulation device 254 is also configured to read the selection barcode(s) printed on the paper ballot 252 to determine the voting selections made by the voter. The voting selections are then stored in a cast vote record (CVR) for the paper ballot 252. The decoding schemas that may be used to decode the voting selections from the selection barcode(s) will be described in greater detail below.

The ballot tabulation device 254 has been described above as having the capability of reading various type of information from the paper ballot 252. In most embodiments, the ballot tabulation device 252 is configured to capture an image of the paper ballot 252 and store that image with the CVR for the paper ballot 252. In these embodiments, the ballot tabulation device 254 will typically read the information from the image of the paper ballot 252 (not from the paper ballot 252 itself). Thus, it should be understood that any references in the present disclosure to reading information from a paper ballot includes both reading the information from the physical ballot and reading the information from an image of the paper ballot.

Once the paper ballot 252 has been fully processed, the ballot tabulation device 254 discharges the ballot into an attached ballot receptacle for storage along with the ballots of other voters.

When the polls are closed, the ballot tabulation device 254 is configured to create a summary of the election results, i.e., the total vote count for all of the CVRs stored on the ballot tabulation device 254. If the poll is an election day poll, the ballot tabulation device 254 may also be configured to print a summary tape showing the election results.

The ballot tabulation device 254 is also configured to store a variety of information on a storage medium (e.g., a removable storage device such as a USB flash drive, a memory card, and the like). The information stored on the storage medium may comprise, for example, the summary of the election results and all of the CVRs. All of the information stored on the storage medium may be encrypted for security purposes. Finally, the storage medium is taken to a central site for processing, as known to one skilled in the art.

Figure 4:
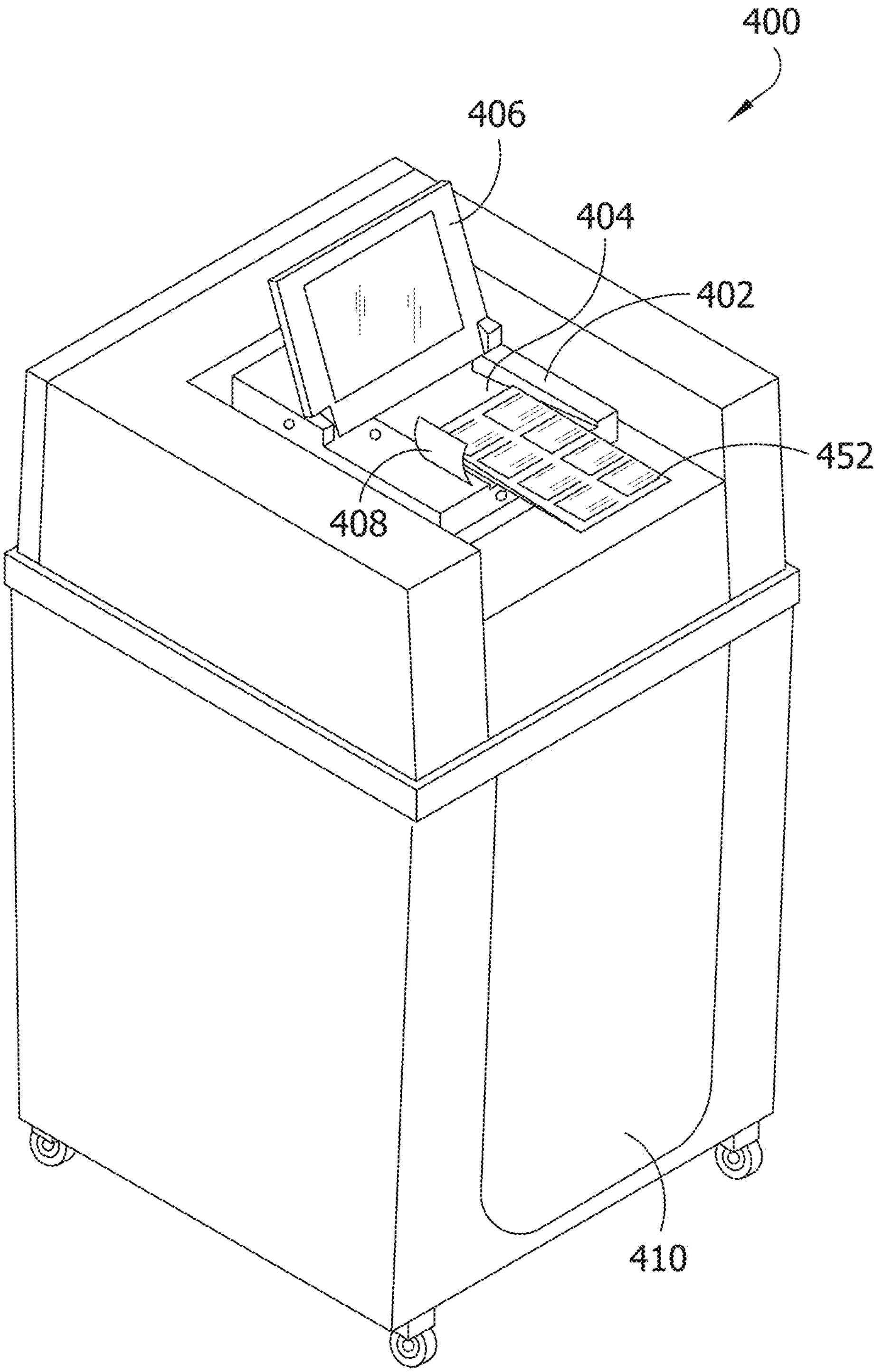
FIG. 4 is a perspective view of an exemplary ballot tabulation device that may be used in the voting system of FIG. 2B.

Referring to FIG. 4, an exemplary embodiment of the ballot tabulation device 254 is generally indicated by reference number 400. Ballot tabulation device 400 generally includes a protective housing 402 with various internal components known in the art, a ballot insertion tray 404, a display 406, and a report printer 408, as described below.

The ballot insertion tray 404 is configured to receive a paper ballot 412 for scanning and tabulation. The ballot insertion tray 404 is preferably molded into the front cover section of the protective housing 402 and is sized to accommodate a particular ballot size. An additional tray insert (not shown) having reversible paper guides may be mounted into the ballot insertion tray 404 to accommodate two different ballot sizes. For example, when the paper guides are oriented down, the ballot insertion tray 404 may accommodate an 8.5-inch-wide standard-size paper ballot (as shown in FIG. 4). When the paper guides are oriented up, the ballot insertion tray 404 may accommodate a 4.25-inch-wide ballot, such as the ballots shown in FIGS. 10 and 14, described below. Of course, other size ballots may also be received within the ballot insertion tray 404 within the scope of the present invention.

The display 406 is preferably an LCD touchscreen display configured to provide a voter interface used to communicate information associated with a scanned paper ballot to the voter (e.g., information regarding ballot irregularities such as over votes, under votes, and blank ballots) and receive voter feedback. The display 406 is connected to the upper portion of the ballot tabulation device 400 by two hinges, one located on each side of the display, which enable the display 406 to open up during use or fold down flat during storage. Of course, other types of displays and input devices are also possible and within the scope of the present invention.

The report printer 408 is an internal printer for device level and polling place level reporting, including the printing of reports at poll opening and poll closing. The report printer 408 is capable of printing on paper that is approximately 3 inches wide and is of the drop-in roll paper type. As shown in FIG. 4, the paper passes through an aperture in the protective housing 402 such that it is easily accessible by users. It should be understood that the report printer may comprise an external printer in other embodiments.

As shown in FIG. 4, the ballot tabulation device 400 mounts onto the top of a ballot receptacle 410. The base of the ballot tabulation device 400 includes four mounting feet (not shown) that provide airflow under the unit and allow it to be securely inserted into a recessed area of the ballot receptacle 410. In this embodiment, the ballot tabulation device 400 slides onto mounting rails (not shown) located on top of the ballot receptacle 410. The ballot receptacle 410 is preferably made of steel or a durable plastic material for security purposes. In operation, scanned and tabulated ballots are deposited directly into the ballot receptacle 410. Of course, the ballot receptacle 410 may have other configurations as are well known to one skilled in the art.

Examples of suitable ballot tabulation devices that may be modified for use as the ballot tabulation device 254 in the voting system 250 (e.g., by adding all of the functionality relating to the decoding of the voting selections from the selection barcode(s) printed on the paper ballot 252, as described herein) are the DS200® precinct scanner and tabulator, the DS450® central scanner and tabulator, and the DS850® central scanner and tabulator, all of which are available from Election Systems & Software, LLC.

II. Encoding and Decoding Schemas

In general, the voting systems and methods described herein utilize encoding schemas that enable a voter's voting selections to be encoded in a compressed format within one or more selection barcodes printed on a paper ballot, as well as decoding schemas that enable the selection barcodes to be read and decoded to determine the voting selections for purposes of tabulation. A variety of different encoding and decoding schemas may be utilized in accordance with the invention, the general principles of which should be understood from the exemplary embodiments described below.

Any type of voting device that prints a paper ballot with a summary of the voter's voting selections may utilize the encoding schemas described herein, such as the voting device 206 of FIG. 2A or the voting device 300 of FIG. 3. In some embodiments, the voting device includes a processing unit configured to perform a variety of operations, including: (1) providing a user interface that presents one or more voting choices for each of one or more contests, and enabling a voter to select one or more of the voting choices for each of the one or more contests; (2) creating a bitmap comprising a plurality of bit cells each of which corresponds to one of the voting choices of one of the contests, wherein each of the bit cells stores a binary digit that indicates whether the voter selected the voting choice corresponding to the bit cell; (3) converting the binary digits stored in the bitmap to a compressed string of characters; and (4) generating one or more selection barcodes that encode the compressed string of characters. The voting device also includes a printer configured to print the one or more selection barcodes on a paper medium to create a paper ballot.

Also, any type of ballot tabulation device that decodes the one or more selection barcodes printed on a paper ballot to determine the voting selections for purposes of tabulation may utilize the decoding schemas described herein, such as the ballot tabulation device 254 of FIG. 2B, the ballot tabulation device 400 of FIG. 4, or the voting device 206 of FIG. 2A or voting device 300 of FIG. 3 (when operating as a combined ballot marking device/ballot tabulation device). In some embodiments, the ballot tabulation device is configured to perform a variety of operations, including: (1) reading the one or more selection barcodes printed on the paper ballot to decode the compressed string of characters; (2) converting the compressed string of characters to binary digits; (3) analyzing the binary digits to determine the selected voting choices; and (4) storing the selected voting choices in a cast vote record for the paper ballot.

In some embodiments, the encoding and decoding schemas are based on a bitmap in which each of the bit cells represents an oval position on a standard-size paper ballot. In order to create the bitmap, the ballot style is associated with one or more ballot sheets and the XML (Extensible Markup Language) data file for each ballot sheet is extracted. Within the XML data file, the oval positions are ordered starting with the side number (i.e., the oval positions on the front side are ordered before the oval positions on the back side), followed by the column number (i.e., the oval positions are ordered from the lowest to the highest column numbers), followed by the row number (i.e., the oval positions are ordered from the lowest to the highest row numbers).

FIG. 5 shows a portion of an exemplary XML data file for one contest with five candidates. The contest name is CONTEST 0001 with a contest identifier of 0001. The candidate names are CANDIDATE 0001, CANDIDATE 0002, CANDIDATE 0003, CANDIDATE 0004, and CANDIDATE 0005 with candidate identifiers of 101, 102, 103, 104 and 105, respectively. As can be seen, the oval position for the first candidate is located on side 1 of the ballot sheet at column 9, row 10, the oval position for the second candidate is located on side 1 of the ballot sheet at column 9, row 13, the oval position for the third candidate is located on side 1 of the ballot sheet at column 9, row 16, the oval position for the fourth candidate is located on side 1 of the ballot sheet at column 9, row 19, and the oval position for the fifth candidate is located on side 1 of the ballot sheet at column 9, row 22.

FIG. 6 shows an exemplary bitmap corresponding to the contest defined in the XML data file of FIG. 5. As can be seen, each of the bit cells in the bitmap corresponds to one of the oval positions on the ballot sheet and stores a binary digit that indicates whether the voter selected the voting choice corresponding to the oval position. In this example, the binary digit "1" is used to indicate a voting selection, i.e., the bit cell corresponding to the oval position of the selected candidate stores a binary digit of "1," and the remaining bit cells store a binary digit of "0."

It should be understood that a ballot sheet will typically include a variety of contests and corresponding candidates, and that the binary digits representing the voted oval positions for all of the candidates may be encoded using different encoding schemas and decoded using corresponding decoding schemas. Examples of such encoding schemas are provided below. Of course, it should be understood that the decoding schema for each of these examples includes the same steps as those of the encoding scheme, but performed in the reverse order.

Example 1 (Binary to Octal Encoding)

FIG. 7 shows an exemplary bitmap for a ballot sheet that includes twelve contests (contests #1-#12) with five candidates per contest (candidates #1-#5). As can be seen, the bitmap includes a bit cell corresponding to the oval position of each of the candidates of each of the contests, and each bit cell stores the binary digit "0" if the candidate was not selected by the voter and the binary digit "1" if the candidate was selected by the voter. It can be appreciated that the voter was allowed to select one candidate for most of the contests, with the except of contest #3 (a "vote for two" contest) and contest #4 (a "vote for three" contest). In this example, the binary digits 10000 represent the voted oval positions for contest #1, the binary digits 01000 represent the voted oval positions for contest #2, the binary digits 00011 represent the voted oval positions for contest #3, the binary digits 10011 represent the voted oval positions for contest #4, the binary digits 00001 represent the voted oval positions for contest #5, the binary digits 10000 represent the voted oval positions for contest #6, the binary digits 01000 represent the voted oval positions for contest #7, the binary digits 00100 represent the voted oval positions for contest #8, the binary digits 00010 represent the voted oval positions for contest #9, the binary digits 00001 represent the voted oval positions for contest #10, the binary digits 10000 represent the voted oval positions for contest #11, and the binary digits 01000 represent the voted oval positions for contest #12.

The binary digits stored in the bitmap are grouped into clusters of three bits that are read from left to right, as shown, which results in the twenty clusters shown in FIG. 7. The binary digits in each of the clusters are then converted from binary (i.e., a base-2 numeral system) to octal (i.e., a base-8 numeral system), i.e., each cluster of three bits is represented by one of the octal numbers 0-7. FIG. 8 shows the binary to octal conversion for each of the twenty clusters. Of course, in other examples, the last cluster may not have exactly three bits as in the example shown. In that case, the one or two bits of the last cluster may be appended with two or one trailing zeroes, respectively, so that the cluster may be represented as an octal number. With the twenty clusters of this example, it can be appreciated that the octal numbers form a compressed string of numeric characters of 40403460602020203010.

Next, the compressed string of numeric characters is encoded into a selection barcode. In this example, the selection barcode comprises a one-dimensional barcode (i.e., a Code 128*c* barcode) that is capable of encoding 35 digits. Because the compressed string of numeric characters includes 20 digits, the fifteen digits to the right of the string are all set to zero. As such, the string 40403460602020203010000000000000000 is encoded in the barcode, as shown in FIG. 9. This barcode includes two data regions—a barcode number n and the 35-digit octal-encoded string of numeric characters—as well as the start, stop, and checksum regions of the Code 128*c* barcode. The barcode number n comprises a number between 1 and 9 and is used by the decoder to determine the order of the barcodes (i.e., the barcodes are printed in order on the paper ballot, but may not be scanned and processed in order). In this example, there is only one selection barcode and, thus, the barcode number n is 1.

Figure 10:
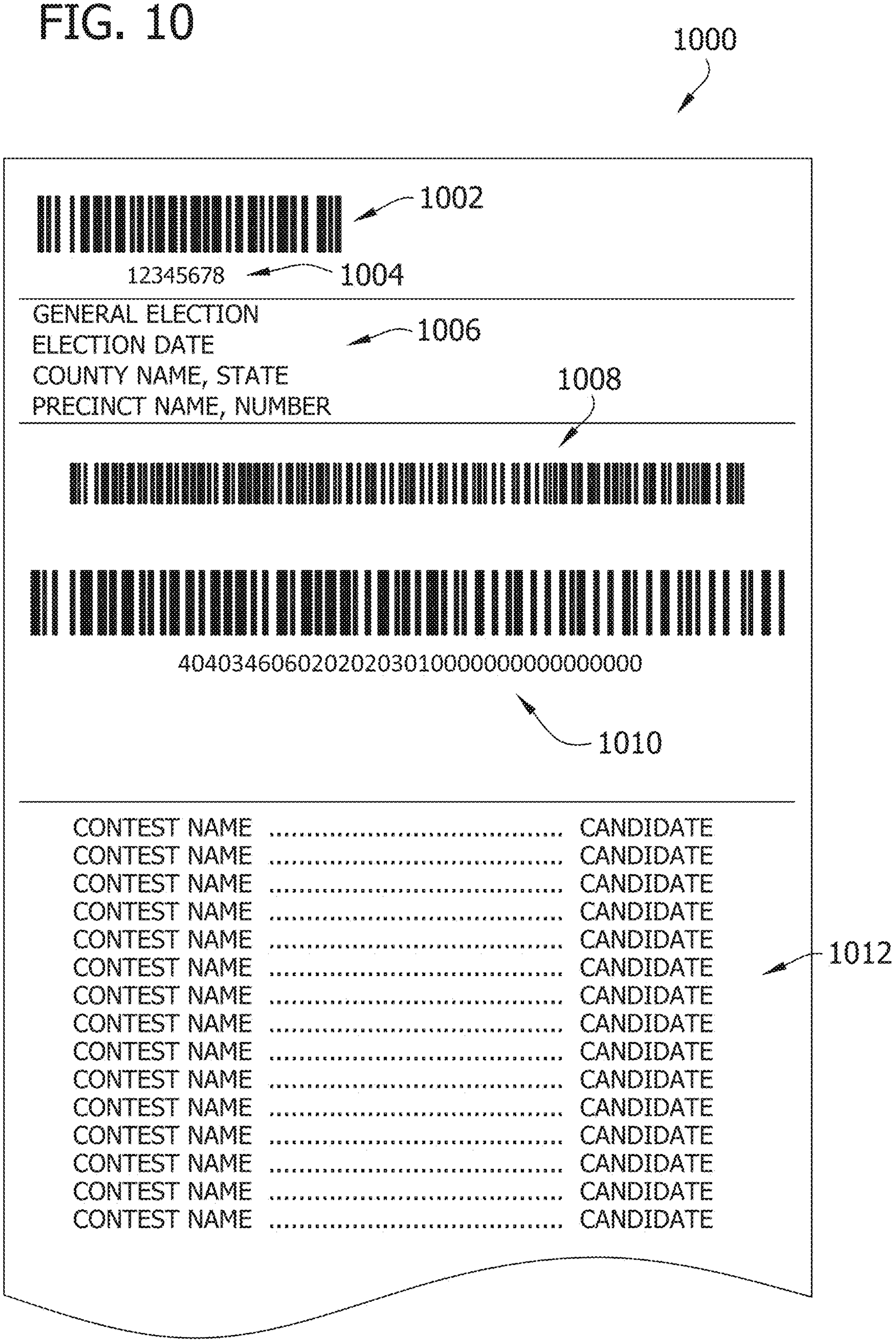
FIG. 10 illustrates an exemplary paper ballot that includes the barcode shown in FIG. 9, which may be generated by the voting device of FIG. 2A and tabulated by either the voting device of FIG. 2A (when operated as a ballot marking device/ballot tabulation device) or the ballot tabulation device of FIG. 2B.

Finally, the selection barcode is printed on the paper ballot, such as the paper ballot 1000 shown in FIG. 10. Paper ballot 1000 comprises a 4.25-inch-wide ballot that includes the following elements: an activation barcode 1002 that encodes an eight-digit election code along with human-readable verification digits 1004; human-readable header text 1006; a master barcode 1008 that encodes a twenty-eight-digit number that includes a precinct identifier (10 digits), a ballot style identifier (10 digits), the number of write-in votes (3 digits), the total number of voting selections (3 digits), the judges' initial box status (1 digit), and the review box status (1 digit); and human-readable text identifying the voting selections made by the voter 1012. These elements are the same as those described above in connection with the paper ballot 100 shown in FIG. 1. However, instead of the fifteen selection barcodes 110 printed on paper ballot 100, paper ballot 1000 only includes a single selection barcode 1010 that encodes the compressed string of numeric characters described above.

It can be appreciated that the single selection barcode 1010 occupies less space on the paper ballot 1000 than the fifteen selection barcodes 110 of paper ballot 100. Specifically, each of selection barcodes 110 has a height of 32 pixels/0.16 inches and a width of 204 pixels/1.02 inches. By contrast, selection barcode 1010 has a height of 60 pixels/0.30 inches and a width of 700 pixels/3.50 inches. With the encoding schema of this example, up to 315 oval positions may be encoded within three barcodes that fit within the first 3.5 inches of the paper ballot (including the header space).

Tables 1 and 2 below illustrate the maximum number of voting selections and maximum number of contests that may be encoded in two barcodes with 210 potential oval positions (Table 1) or three barcodes with 315 potential oval positions (Table 2) depending on the type of contest on the ballot:

TABLE 1

| Two Barcodes | Max # Selections | Max # Contests |
|---|---|---|
| Vote for 1, Contests with 2 candidates | 105 | 105 |
| Vote for 1, Contests with 3 candidates | 70 | 70 |
| Vote for 2, Contests with 3 candidates | 140 | 70 |
| Vote for 1, Contests with 4 candidates | 52 | 52 |
| Vote for 2, Contests with 4 candidates | 104 | 52 |
| Vote for 1, Contests with 5 candidates | 42 | 42 |
| Vote for 1, Contests with 10 candidates | 21 | 21 |

TABLE 2

| Three Barcodes | Max # Selections | Max # Contests |
|---|---|---|
| Vote for 1, Contests with 2 candidates | 152 | 152 |
| Vote for 1, Contests with 3 candidates | 105 | 105 |
| Vote for 2, Contests with 3 candidates | 210 | 105 |
| Vote for 1, Contests with 4 candidates | 78 | 78 |
| Vote for 2, Contests with 4 candidates | 156 | 78 |
| Vote for 1, Contests with 5 candidates | 63 | 63 |
| Vote for 1, Contests with 10 candidates | 31 | 31 |

Thus, one skilled in the art will appreciate that the encoding schemas described above enable the use of selection barcode(s) that occupy less space on the paper ballot and, thus, the length of the paper ballot is reduced. Paper ballots with reduced length provide a number of advantages, including: the cost of card stock used for the paper ballots (e.g., thermal printable cards) will be lower for the jurisdiction; a voting device can print and/or scan reduced-length paper ballots in less time; reduced-length paper ballots are less likely to become jammed in the voting device; and reduced-length paper ballots can be scanned faster in implementations that use a central scanner as the ballot tabulation device. Other advantages will be apparent to one skilled in the art.

Example 2 (Binary to Hexadecimal Encoding)

FIG. 11 shows an exemplary bitmap for a ballot sheet that includes twelve contests (contests #1-#12) with five candidates per contest (candidates #1-#5), i.e., the same bitmap as that shown in FIG. 7. However, in this example, the binary digits stored in the bitmap are grouped into clusters of eight bits that are read from right to left, as shown, which results in eight clusters. Note that the last cluster only includes 4 bits and, thus, the bits of this cluster are padded with four zeroes before the bits are read from right to left. The binary digits in each of the clusters are then converted from binary (i.e., a base-2 numeral system) to hexadecimal (i.e., a base-16 numeral system), i.e., each cluster of eight bits is represented by two of the values 0-9 and A-F. FIG. 12 shows the binary to hexadecimal conversion for each of the eight clusters. With the eight clusters of this example, it can be appreciated that the hexadecimal values form a compressed string of alphanumeric characters of 41E0008320080601.

Next, the compressed string of alphanumeric characters is encoded into a selection barcode. In this example, the selection barcode comprises a two-dimensional barcode (i.e., a Data Matrix barcode), as shown in FIG. 13. It can be appreciated that other information may be encoded in the selection barcode along with the compressed string of alphanumeric characters. In this example, the selection barcode encodes the information that was encoded in the master barcode 1008 of the paper ballot 1000 shown in FIG. 10. For example, assume that the precinct identifier is 5036422201 (10 digits), the ballot style identifier is 0000000003 (10 digits), the number of write-in votes is 000 (3 digits), the total number of voting selections is 015 (3 digits), the judges' initial box status is 0 (1 digit), and the review box status is 0 (1 digit). In this case, the value 50364222010000000003000015000000 is encoded in the selection barcode, wherein the value is padded with four zeroes to create a thirty-two digit number. In this example, the selection barcode also encodes a four-letter abbreviation of each candidate name along with the two-digit contest number and one-digit candidate number in the following form: CAND<Contest #>-<Candidate #>). Thus, the encoded information for the bitmap shown in FIG. 11 is as follows: 50364222010000000003000015000000014|E0008-320080601|CAND01-1|CAND02-2|CAND03-4|CAND03-5|CAND04-1|CAND04-4|CAND04-5|CAND05-5|CAND06-1|CAND07-2|CAND08-3|CAND09-4|CAND10-5|CAND11-1|CAND12-2. Of course, it should be understood that the information may be encoded in the selection barcode in any order. As described below, a computing device running a suitable software application may be used to decode the barcode and present the encoded information to the voter. As such, the voter viewing the decoded letters (i.e., abbreviation of the candidate name) may have a higher level of confidence that his/her voting selections have been correctly encoded in the selection barcode.

Figure 14:
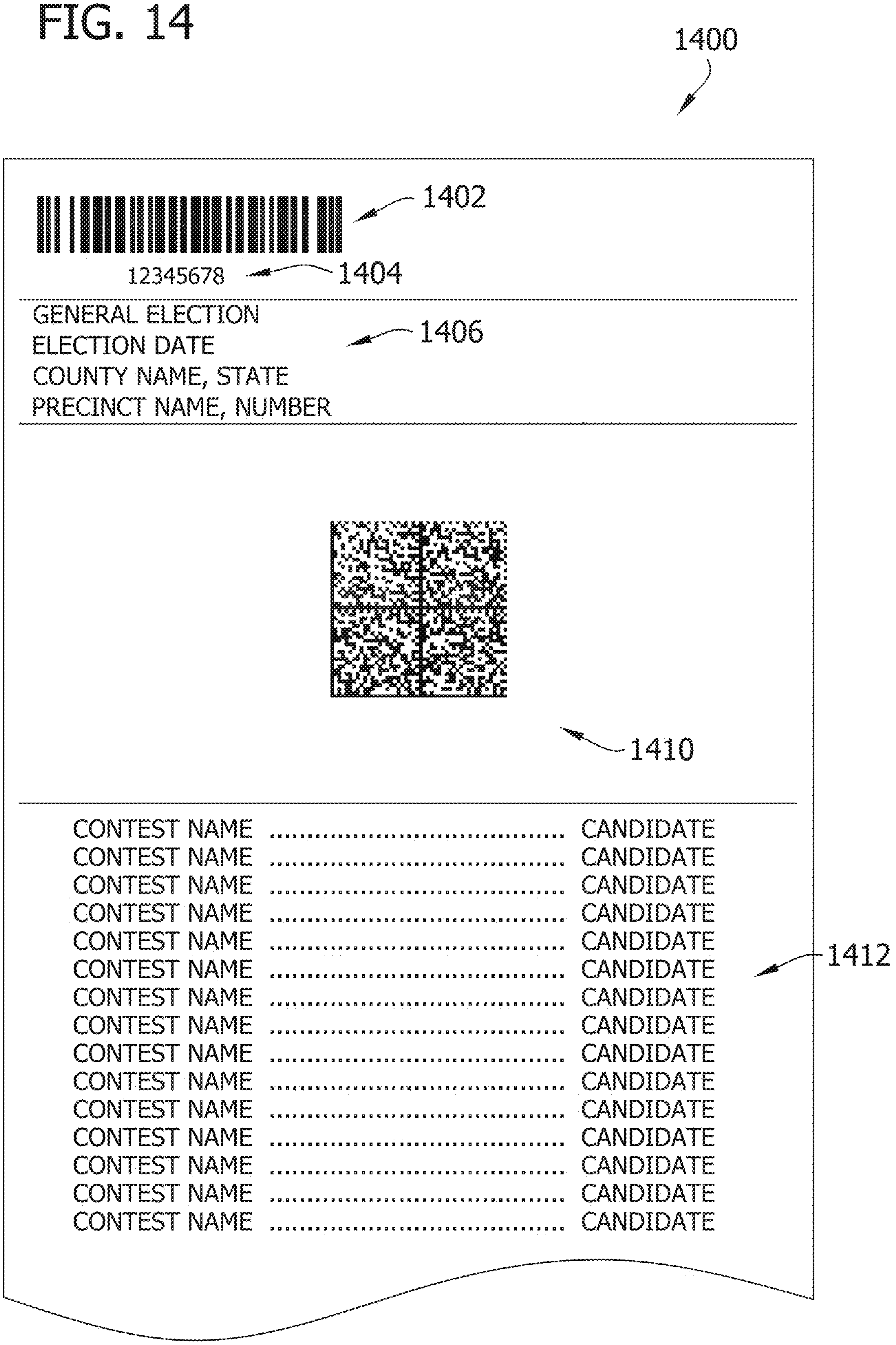
FIG. 14 illustrates an exemplary paper ballot that includes the barcode shown in FIG. 13, which may be generated by the voting device of FIG. 2A and tabulated by either the voting device of FIG. 2A (when operated as a ballot marking device/ballot tabulation device) or the ballot tabulation device of FIG. 2B.

Finally, the selection barcode is printed on the paper ballot, such as the paper ballot 1400 shown in FIG. 14. Paper ballot 1400 comprises a 4.25-inch-wide ballot that includes the following elements: an activation barcode 1402 that encodes an eight-digit election code along with human-readable verification digits 1404; human-readable header text 1406; the selection barcode 1410; and human-readable text identifying the voting selections made by the voter 1412. These elements are the same as those described above in connection with the paper ballot 100 shown in FIG. 1 (noting that a separate master barcode is not required). However, instead of the fifteen selection barcodes 110 printed on paper ballot 100, paper ballot 1400 only includes a single selection barcode 1410 that encodes the compressed string of alphanumeric characters described above, as well as the information previously encoded in a master barcode and the abbreviation of each selected candidate name. It can be appreciated that the single selection barcode 1410 occupies less space on the paper ballot 1400 than the fifteen selection barcodes 110 of paper ballot 100, which enables the use of reduced-length paper ballots. The advantages associated with the use of reduced-length paper ballots are described above in connection with Example 1 (e.g., lower cost of card stock; lower printing and/or scanning times; less likelihood of paper jams, etc.).

As described above, a computing device running a suitable software application may be used to decode the selection barcode(s) printed on the paper ballot (e.g., the selection barcode 1410 of paper ballot 1400 shown in FIG. 14) and present the decoded information for review by the voter. This review process will typically be performed after the voting device has discharged the paper ballot to the voter, but before the voter inserts the paper ballot into the ballot tabulation device for tabulation.

Figure 15:
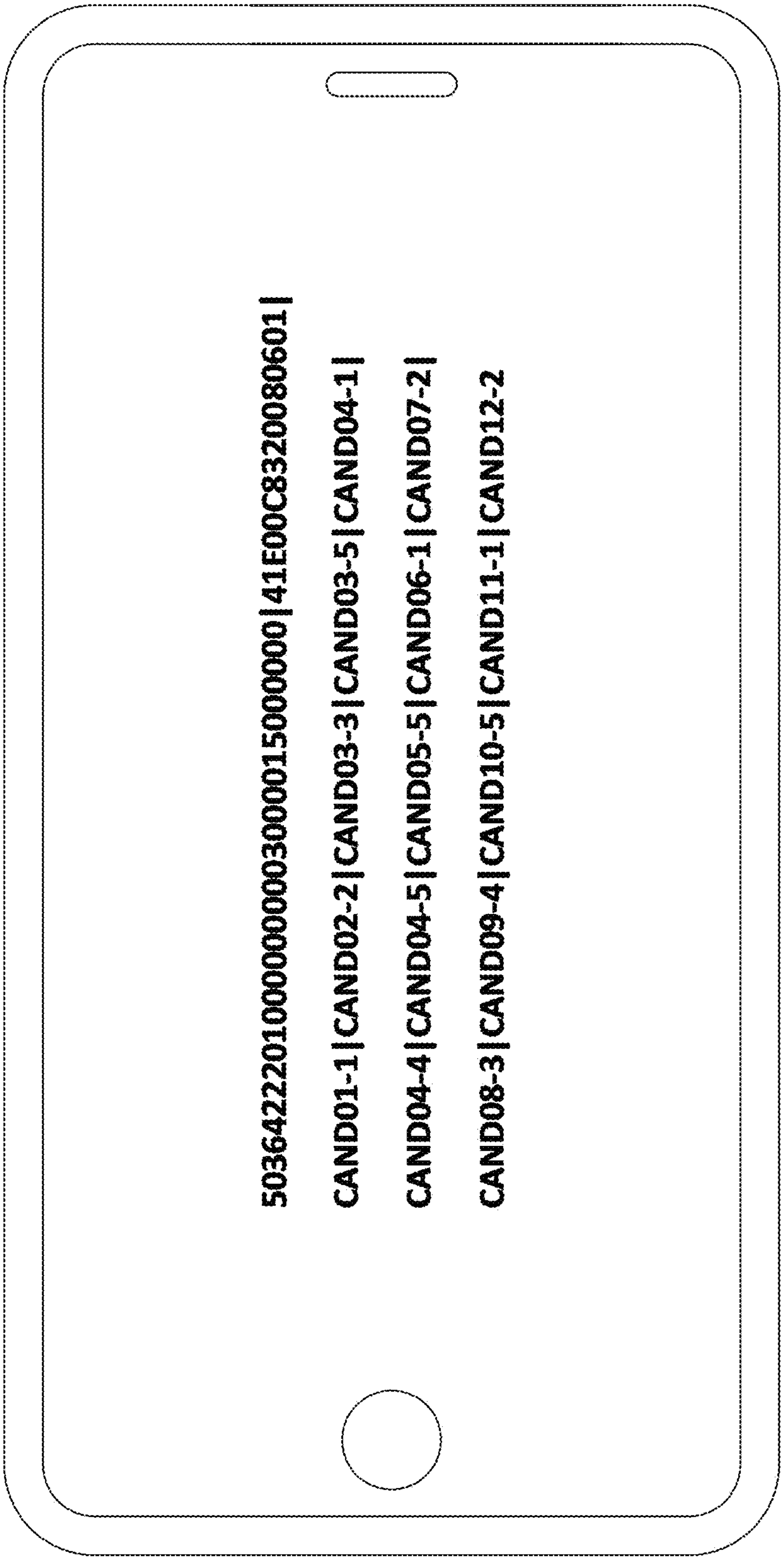
FIG. 15 is an exemplary screen shot of a computing device showing the information decoded from the barcode shown in FIGS. 13 and 14.

In some embodiments, the computing device comprises a personal computing device of the voter, such as a smartphone or personal computing tablet (e.g., those made by Apple® and Samsung®, and others as well known to one skilled in the art) or any other electronic computing device known in the art. In this case, the manufacturer of the voting system provides a software application that is available for download in advance of the election. Once downloaded, the voter can use the application (which operates in conjunction with the camera of the personal computing device) to decode the selection barcode(s) printed on the voter's paper ballot whereby the decoded information is presented on the electronic visual display of the personal computing device. For example, the information decoded from the selection barcode 1410 of paper ballot 1400 shown in FIG. 14 may be presented on the electronic visual display of a smartphone, as shown in FIG. 15. It can be seen that the decoded information includes an abbreviation of the name of each selected candidate. The number of letters of each candidate name that are encoded in the selection barcode(s) may vary between different applications, e.g., the candidate names BIDEN or TRUMP may be presented on the electronic visual display in the last presidential election (as well as the names of any other selected candidates for a particular ballot). It is believed that a voter viewing the decoded information may have a higher level of confidence that his/her voting selections have been correctly encoded in the selection barcode(s).

In some embodiments, the computing device comprises a computing device (e.g., a computing tablet or any electronic computing device known in the art) that is provided for use by all of the voters, i.e., the computing device essentially functions as a ballot decoding kiosk at the polling location. The computing device runs the software application described above and, thus, the computing device is programmed to decode the selection barcode(s) printed on a voter's paper ballot and present the decoded information on the electronic visual display of the computing device. Preferably, the ballot decoding kiosk includes a suitable privacy screen that enables the voter to view the decoded information in privacy.

Alternative Examples

It should be understood that a variety of different encoding and decoding schemas may be utilized in accordance with the invention and that the invention is not limited to the examples described above.

For example, the encoding and decoding schemas described above are based on a bitmap in which the binary digit "1" is used to indicate a voting selection, i.e., each bit cell corresponding to the oval position of a selected candidate stores a binary digit of "1," and the remaining bit cells store a binary digit of "0." In other examples, the binary digit "0" may be used to indicate a voting selection.

Also, the encoding and decoding schemas described above are based on a bitmap in which the oval positions are ordered starting with the side number (i.e., the oval positions on the front side are ordered before the oval positions on the back side), followed by the column number (i.e., the oval positions are ordered from the lowest to the highest column numbers), followed by the row number (i.e., the oval positions are ordered from the lowest to the highest row numbers). In other examples, the order of the oval positions may be determined in a variety of other ways, such as side/column/row, column/row/side, row/column/side, column/side/row, row/side/column, or the highest to the lowest column and/or row numbers. Of course, other ordering schemas will be apparent to one skilled in the art.

In addition, the encoding and decoding schemas described above are based on the conversion of bits from a binary numeral system to either an octal numeral system (in which each cluster of three bits is represented by one of the octal numbers 0-7) or a hexadecimal numeral system (in which each cluster of eight bits is represented by two of the values 0-9 and A-F). Other types of conversion schemas that enable compression of the bits will be apparent to one skilled in the art.

Further, the encoding and decoding schemas described above are based on a bitmap in which the bit cells represent each of the oval positions on a standard-size paper ballot. In other examples, the bit cells may represent candidate numbers, oval numbers (rather than oval positions), or any other identifier that enables each of the bit cells to correspond with one of the voting choices of one of the contests.

Of course, other exemplary encoding and decoding schemas will be apparent to one skilled in the art based on the examples described herein and the other teachings of this disclosure.

Finally, it should also be noted that the barcodes printed on the paper ballots, as illustrated in FIGS. 10 and 14, are merely examples and that barcodes of various types and sizes may be used. For example, the size of the barcodes may be dependent on the number of contests in the election and the corresponding amount of data to be encoded in the barcodes.

III. General Information

The description set forth above provides several exemplary embodiments of the inventive subject matter. Although each exemplary embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

The use of any and all examples or exemplary language (e.g., "such as" or "for example") provided with respect to certain embodiments is intended merely to better describe the invention and does not pose a limitation on the scope of the invention. No language in the description should be construed as indicating any non-claimed element essential to the practice of the invention.

The use of the terms "comprises," "comprising," or any other variation thereof, are intended to cover a non-exclusive inclusion, such that a system or method that comprises a list of elements does not include only those elements, but may include other elements not expressly listed or inherent to such system or method.

Finally, while the present invention has been described and illustrated hereinabove with reference to various exemplary embodiments, it should be understood that various modifications could be made to these embodiments without departing from the scope of the invention. Therefore, the present invention is not to be limited to the specific structural configurations or methodologies of the exemplary embodiments, except insofar as such limitations are included in the following claims.

What is claimed and desired to be secured by Letters Patent is as follows:

1. A voting device, comprising:

a processing unit configured to:

a. provide a user interface that (i) presents one or more voting choices for each of one or more contests and (ii) enables a voter to select one or more of the voting choices for each of the one or more contests;

b. create a bitmap comprising a plurality of bit cells each of which corresponds to one of the voting choices of one of the contests such that each bit cell corresponds to a single voting choice, wherein each bit cell stores a binary digit that indicates whether the voter selected the voting choice corresponding to the bit cell, wherein the binary digit stored in each bit cell of the bitmap comprises one of (i) a first binary digit if the voting choice corresponding to the bit cell is not selected by the voter and (ii) a second binary digit if the voting choice corresponding to the bit cell is selected by the voter, wherein the first binary digit is different than the second binary digit;

c. convert the binary digits stored in the bitmap to a compressed string of characters;

d. generate one or more selection barcodes that encode the compressed string of characters; and a printer configured to print the one or more selection barcodes on a paper medium to create a paper ballot.

2. The voting device of claim 1, wherein the binary digit stored in each bit cell of the bitmap comprises a zero if the voting choice corresponding to the bit cell is not selected by the voter and a one if the voting choice corresponding to the bit cell is selected by the voter.

3. The voting device of claim 1, wherein each bit cell of the bitmap corresponds to an oval position on a standard-size paper ballot.

4. The voting device of claim 1, wherein the binary digits stored in the bitmap are grouped so that each of a plurality of groups comprises three binary digits, and wherein each of the groups of three binary digits is converted to an octal representation of the three binary digits to create a compressed string of numeric characters.

5. The voting device of claim 4, wherein each of the one or more selection barcodes comprises a one-dimensional barcode that encodes all or a portion of the compressed string of numeric characters.

6. The voting device of claim 1, wherein the binary digits stored in the bitmap are grouped so that each of a plurality of groups comprises eight binary digits, and wherein each of the groups of eight binary digits is converted to a hexadecimal representation of the eight binary digits to create a compressed string of alphanumeric characters.

7. The voting device of claim 6, wherein each of the one or more selection barcodes comprises a two-dimensional barcode that encodes all or a portion of the compressed string of alphanumeric characters.

8. The voting device of claim 7, wherein each of the one or more selection barcodes further encodes a plurality of letters that represent each of the selected voting choices.

9. The voting device of claim 1, further comprising a reading device configured to read the one or more selection barcodes printed on the paper ballot to decode the compressed string of characters, wherein the processing unit is further configured to: (a) convert the compressed string of characters to binary digits, (b) analyze the binary digits to determine the selected voting choices, and (c) store the selected voting choices in a cast vote record for the paper ballot.

10. A method for generating a paper ballot, comprising:

presenting one or more voting choices for each of one or more contests;

receiving one more selections of one or more of the voting choices for each of the one or more contests;

creating a bitmap comprising a plurality of bit cells each of which corresponds to one of the voting choices of one of the contests such that each bit cell corresponds to a single voting choice, wherein each bit cell stores a binary digit that indicates whether the voting choice corresponding to the bit cell is selected, wherein the binary digit stored in each bit cell of the bitmap comprises one of (i) a first binary digit if the voting choice corresponding to the bit cell is not selected and (ii) a second binary digit if the voting choice corresponding to the bit cell is selected, wherein the first binary digit is different than the second binary digit;

converting the binary digits stored in the bitmap to a compressed string of characters;

generating one or more selection barcodes that encode the compressed string of characters; and printing the one or more selection barcodes on a paper medium to create the paper ballot.

11. The method of claim 10, wherein the binary digit stored in each bit cell of the bitmap comprises a zero if the voting choice corresponding to the bit cell is not selected and a one if the voting choice corresponding to the bit cell is selected.

12. The method of claim 10, wherein each bit cell of the bitmap corresponds to an oval position on a standard-size paper ballot.

13. The method of claim 10, wherein the converting step comprises (i) grouping the binary digits stored in the bitmap so that each of a plurality of groups comprises three binary digits and (ii) converting each of the groups of three binary digits to an octal representation of the three binary digits to create a compressed string of numeric characters.

14. The method system of claim 13, wherein each of the one or more selection barcodes comprises a one-dimensional barcode that encodes all or a portion of the compressed string of numeric characters.

15. The method of claim 10, wherein the converting step comprises (i) grouping the binary digits stored in the bitmap so that each of a plurality of groups comprises eight binary digits and (ii) converting each of the groups of eight binary digits to a hexadecimal representation of the eight binary digits to create a compressed string of alphanumeric characters.

16. The method of claim 15, wherein each of the one or more selection barcodes comprises a two-dimensional barcode that encodes all or a portion of the compressed string of alphanumeric characters.

17. The method of claim 16, wherein each of the one or more selection barcodes further encodes a plurality of letters that represent each of the selected voting choices.

18. The method of claim 10, further comprising:

reading the one or more selection barcodes printed on the paper ballot to decode the compressed string of characters;

converting the compressed string of characters to binary digits;

analyzing the binary digits to determine the selected voting choices; and storing the selected voting choices in a cast vote record for the paper ballot.

19. A voting system, comprising:

a voting device configured to: (a) provide a user interface that (i) presents one or more voting choices for each of one or more contests and (ii) enables a voter to select one or more of the voting choices for each of the one or more contests; (b) create a bitmap comprising a plurality of bit cells each of which corresponds to one of the voting choices of one of the contests such that each bit cell corresponds to a single voting choice, wherein each bit cell stores a binary digit that indicates whether the voter selected the voting choice corresponding to the bit cell; (c) convert the binary digits stored in the bitmap to a compressed string of characters; (d) generate one or more selection barcodes that encode the compressed string of characters; and (e) print the one or more selection barcodes on a paper medium to create a paper ballot; and a ballot tabulation device configured to: (a) read the one or more selection barcodes printed on the paper ballot to decode the compressed string of characters; (b) convert the compressed string of characters to binary digits; (c) analyze the binary digits to determine the selected voting choices; and (d) store the selected voting choices in a cast vote record for the paper ballot.

20. The voting system of claim 19, wherein the binary digit stored in each bit cell of the bitmap comprises a zero if the voting choice corresponding to the bit cell is not selected by the voter and a one if the voting choice corresponding to the bit cell is selected by the voter.

21. The voting system of claim 19, wherein each bit cell of the bitmap corresponds to an oval position on a standard-size paper ballot.

22. The voting system of claim 19, wherein the binary digits stored in the bitmap are grouped so that each of a plurality of groups comprises three binary digits, and wherein each of the groups of three binary digits is converted to an octal representation of the three binary digits to create a compressed string of numeric characters.

23. The voting system of claim 22, wherein each of the one or more selection barcodes comprises a one-dimensional barcode that encodes all or a portion of the compressed string of numeric characters.

24. The voting system of claim 19, wherein the binary digits stored in the bitmap are grouped so that each of a plurality of groups comprises eight binary digits, and wherein each of the groups of eight binary digits is converted to a hexadecimal representation of the eight binary digits to create a compressed string of alphanumeric characters.

25. The voting system of claim 24, wherein each of the one or more selection barcodes comprises a two-dimensional barcode that encodes all or a portion of the compressed string of alphanumeric characters.

26. The voting system of claim 25, wherein each of the one or more selection barcodes further encodes a plurality of letters that represent each of the selected voting choices.

27. The voting system of claim 26, further comprising a software application executable on a computing device, wherein the software application causes the computing device to read each of the one or more selection barcodes printed on the paper ballot to decode the letters that represent each of the selected voting choices and present the letters for review by the voter.

28. The voting system of claim 27, wherein the computing device comprises one of a smartphone, a personal computing tablet, or a smart watch.

29. The voting system of claim 27, wherein the computing device comprises a kiosk available for use by a plurality of voters at a polling location.

30. The voting system of claim 19, wherein the voting device comprises the ballot tabulation device.

* * * * *